(12) United States Patent
Fujisawa

(10) Patent No.: US 6,593,217 B1
(45) Date of Patent: Jul. 15, 2003

(54) METHOD OF MANUFACTURING SEMICONDUCTOR DEVICE

(75) Inventor: Masahiko Fujisawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 13 days.

(21) Appl. No.: 09/635,901

(22) Filed: Aug. 11, 2000

(30) Foreign Application Priority Data

Mar. 3, 2000 (JP) .................................. 2000-058560

(51) Int. Cl.[7] ........................ H01L 21/20; H01L 21/36; H01L 21/44
(52) U.S. Cl. .................. 438/495; 438/231; 438/264; 438/435; 438/583; 438/589; 438/655
(58) Field of Search ................. 438/495, 231, 438/232, 589, 621, 435, 424, 436, 437, 364, 365, 583, 655, 683, 656, 637

(56) References Cited

U.S. PATENT DOCUMENTS 5,605,865 A * 2/1997 Maniar .................... 438/682
6,147,405 A * 11/2000 Hu ........................... 257/755
6,221,764 B1 * 4/2001 Inoue ...................... 438/649
6,320,261 B1 * 11/2001 Burton et al. ............ 257/754

FOREIGN PATENT DOCUMENTS

| JP | 60-187060 | 9/1985 |
| JP | 3-280532 | 12/1991 |
| JP | 8-172125 | 7/1996 |

* cited by examiner

Primary Examiner—Matthew Smith
Assistant Examiner—Igwe U. Anya
(74) Attorney, Agent, or Firm—McDermott, Will & Emery

(57) ABSTRACT

A semiconductor device with low contact resistance which can cope with the miniaturization of semiconductor devices as well as a manufacturing method thereof which is easy and inexpensive can be obtained. Impurity regions on an Si substrate, an interlayer insulation film, source and drain interconnections, a metal silicide layer larger in diameter than the lower edge of the contact holes around the impurity regions are provided and the metal silicide layer includes an interface making up a border between the upper metal silicide layer contacting with the bottom of the interlayer insulation film and the lower metal silicide layer contacting with the impurity region surface. Thus, the contact area between the source and drain lines and the impurity regions can be increased via the metal silicide layer so as to reduce the contact resistance.

12 Claims, 15 Drawing Sheets

METHOD OF MANUFACTURING SEMICONDUCTOR DEVICE

BACKGROUND OF THE INVENTION

1. Field of the Invention

The present invention relates to a semiconductor device and a method for manufacturing the same, and in particular to a semiconductor device, such as a logic-type device of the MPU (Micro Processing Unit), as well as to a method of manufacturing the same, where contact resistance between source lines and source regions, on the one hand, and drain lines and drain regions, on the other hand, is reduced.

2. Description of the Background Art

As for contact holes opened for connecting the silicon substrate and metal lines electrically, it is desirable to make the diameters small in order to miniaturize the semiconductor device, while it is desirable to make the diameters large in order to form contacts of low resistance. Therefore, the contact hole forming technology has come to occupy an increasingly important position as the miniaturization of semiconductor devices progresses. In general, on the bottoms of the contact holes, a metal silicide film is formed with the purpose of reducing the contact resistance between the silicon substrate and the metal film. FIG. 25 is a cross sectional view of a film forming stage of an interlayer insulation film 108 made of a PSG (Phosphate Silicate Glass) film or a BPSG (Boro-Phosphate Silicate Glass) film or the like over the entire surface of the silicon substrate in a manufacturing method according to a prior art. An element isolating insulation film 102 for separating each element forming region, impurity regions 107 which become source and drain regions, a gate insulation film 103, a gate electrode 105 having side walls 106, and an interlayer insulation film 108 for covering the gate electrode and the impurity regions (the source and the drain regions) 107.

A method of manufacturing semiconductor devices up until this stage according to a prior art is as follows. First, the element isolating insulation film 102 is formed on the silicon substrate 101 and each of the element forming regions is separated. Next, a gate insulation film 103 is formed over the entire surface of the silicon substrate, then a polycrystalline silicon film 104 is formed over the entire surface of the silicon substrate, which is patterned to form the gate electrode 105. Here, though an example where a polycrystalline silicon single layer is used as a gate electrode is shown, a gate electrode of a so-called polycide structure where a metal silicide is layered on the polycrystalline silicon may be used. Next, side walls 106 are formed on the both sides of the gate electrode and the impurity regions 107 which become the source and the drain regions are formed in the silicon substrate 101 on the outside of the side walls 106. After ion implantation, heat treatment follows in order to activate implanted ion materials in the impurity regions 107. After this, as shown in FIG. 25, an interlayer insulation film 108 is formed.

Next, as shown in FIG. 26, contact holes 109 are opened at predetermined positions above the gate electrode 105 and the impurity regions. Next, a metal film 110 which becomes a contact layer and a metal film 111 which becomes a barrier layer are formed in sequence (FIG. 27). Here, the barrier layer 111 is provided in order to prevent the silicon and the metal line from reacting with each other. Then, by heat treatment, a metal silicide 112 is formed by turning the metal layer 110 of the contact layer formed on the bottom of the contact holes into a silicide through the heat treatment (FIG. 28). After that, a metal film 113 for lines of a conductive film is formed from tungsten or the like for forming lines (FIG. 29), and the metal film for lines is etched to form metal lines 114 (FIG. 30). In FIG. 31, an enlarged view of the part C of FIG. 30 is shown. On the bottom of the contact holes 109, the metal silicide layer 112 is formed and between the metal lines 114 and the metal silicide layer 112, the barrier metal 111 is formed in order to prevent the metal lines and the silicon from reacting with each other.

The contact resistance of those contact parts are determined by the sum of the resistance of the metal lines 114, an interface resistance between the metal lines 114 and barrier layer 111, the resistance of barrier layer 111, an interface resistance between the barrier layer 111 and the metal silicide layer 112, the resistance of the metal silicide layer 112 and an interface resistance between the metal silicide layer 112 and the source and the drain regions 107. Among those factors, however, the interface resistance between the metal silicide layer 112 and the source and the drain regions is the largest compared to other resistance, and therefore this interface resistance dominates the contact resistance.

Here, the interface resistance between the metal silicide layer 112 and the source and the drain regions 107 at issue is represented by the following equation.

$$\text{The interface resistance } R = \rho/S \tag{1}$$

wherein $\rho$ is an interface resistivity of the interface between the metal silicide layer and the silicon substrate and S is a contact area of the interface between the metal silicide layer and the silicon substrate.

Because of the miniaturization and the higher integration of semiconductor devices which are steadily progressing year after year, the contact hole diameter is being reduced with smaller contact area S of the interface between the metal silicide layer and the silicon substrate resulting in a problem of increasing contact resistance. To solve this problem of increasing contact resistance, the following two methods can be considered based on the above described equation (1).

(A) reducing the interface resistivity $\rho$ of the interface between the silicon substrate and the metal silicide layer.

(B) expanding the contact area S of the interface between the silicon substrate and the metal silicide layer.

A prior art where the contact resistance is reduced by focusing on the expansion of the contact area of the above (B) is described. The method for expanding the contact area S is largely categorized into (a) a method of expanding the interface between the silicon substrate and the metal silicide in the direction of wafer thickness, (b) a method of expanding the interface in the direction parallel to the wafer surface, and (c) a method of increasing the interface area between the silicon substrate and the metal silicide at the bottom of the contact holes.

(a) The method of expanding the interface in the direction of the wafer thickness is the most effective method with respect to the point that the miniaturization of the semiconductor device is attained while the contact resistance can be reduced even when the hole diameter is scaled down without expanding the area of the plane of the contact portion. As an example using this method, there is a method for forming a trench in the impurity region of the semiconductor substrate followed by filling in the trench with metal or metal silicide over which a contact hole is formed (see Japanese Patent Laying-Open No. 60-187060). This method has a problem that the number of steps of the process increases because a trench forming step in the silicon substrate and a contact hole forming step are carried out separately.

As an example using the method (b) of expanding in the direction parallel to the wafer surface, there is a method of forming a metal silicide layer having broader area than that of the contact hole cross section (see Japanese Patent Laying-Open No. 8-172125). This method, however, has a shortcoming that the step of forming the metal silicide layer with broader area than that of the contact hole cross section becomes complicated, which increases the cost.

As an example using (c) the method (c) of increasing the above interface area on the contact hole bottom, there is a method of forming a micro unevenness on the contact hole bottom (see Japanese Patent Laying-Open No. 3-280532). This method has an advantage that the area S of the interface between the silicon substrate and the metal silicide can be increased without expanding the diameter of the contact hole. However, since there is a limitation to the area itself on the contact hole bottom where the unevenness is formed, there is a problem that the effect of controlling the rise of the contact resistance becomes small in the case that the contact hole diameter is scaled down.

SUMMARY OF THE INVENTION

It is an object of the present invention to provide a semiconductor device with low contact resistance of which manufacturing is easy and cost effective, to cope with the miniaturization of the semiconductor device as well as a method of manufacturing the same.

A semiconductor device according to one aspect of this invention has impurity regions formed on the main surface of the silicon substrate, an interlayer insulation film covering the impurity regions and a conductive film formed within contact holes through the interlayer insulation film over the impurity regions and on the interlayer insulation film around the contact holes. This device is also provided with a metal silicide layer which is surrounded by and contacted with the impurity regions and which has the diameter larger than that of the lower edge of the contact hole, in the impurity regions below the bottom of the contact hole. In addition, the above described metal silicide layer in this device includes an upper metal silicide layer contacting the bottom of the interlayer insulation film of the lower edge of the contact hole and an interface bordering on a lower metal silicide layer contacting the impurity regions.

The metal silicide layer of the semiconductor device according to the above described one aspect is formed along the bottom of the expanded recess formed in the impurity regions on the contact hole bottom. This enlarged recess has a diameter larger than that of the contact hole penetrated through the interlayer insulation film. Thereby, a metal CVD (Chemical Vapor Deposition) method or the like is adopted for forming a metal film which becomes the metal silicide layer to corners of the expanded recess. At this time, the metal film formed at the corners of the above expanded recess is generated not only from the bottom of the expanded recess but also from the bottom of the interlayer insulation film. The upper metal film generated from the bottom of the interlayer insulation film and the lower metal film generated from the bottom of the corners of the expanded recess grow toward the inside of the expanded recess respectively from the top and from the bottom of the expanded recess, which meet in the middle of the expanded recess to form an interface in entire corner of the expanded recess. This interface may be called a seam. On the other hand, in most expanded recesses, a metal film grows from the bottom. The metal film becomes metal silicide at the parts contacting the silicon substrate. A metal layer including a seam in the corner part is close to the parts contacting with the silicon substrate, which also becomes metal silicide.

The conductive film or the metal film formed within the contact hole and the conductive film or the metal film formed on the interlayer insulation film around the contact hole may be formed separately or may be formed together.

The above described enlarged recess is provided continuously after opening the contact hole, therefore an additional step for changing the order of processing steps of the prior art is not particularly necessary. Accordingly, the above described manufacturing method according to the present invention can be easily implemented. In this way, by forming an ohmic contact in the expanded recess which is broader than the opening part of the contact hole so as to increase the contact area, a contact of low resistance can be formed while miniaturizing the semiconductor device. The enlarged recess provided in the above described silicon substrate may be a penetrated hole, but preferably an enlarged recess in a form of a trench.

A semiconductor device according to another aspect of this invention is provided with impurity regions formed on the main surface of the silicon substrate, an interlayer insulation film covering the impurity regions, a conductive film formed within a contact hole penetrating the interlayer insulation film over the impurity regions reaching the impurity regions and on the interlayer insulation film around the contact hole, and a metal silicide layer covering the side walls and the bottom of the contact hole bottom surrounded by the impurity regions.

By the formation of the metal silicide layer in the semiconductor device according to the above described another aspect, the contact area can be increased without increasing the two-dimensional area while the miniaturization of the semiconductor device proceeds, enabling a low resistance of the contact. The above described contact hole can be formed without adding further processing steps to the previous process, as an anisotropic etching on the semiconductor substrate follows continuously to the etching of the interlayer insulation film for opening.

A semiconductor device according to still another aspect of this invention is provided with impurity regions formed on the main surface of the silicon substrate, an interlayer insulation film covering impurity regions, a conductive film formed within a contact hole penetrating the interlayer insulation film over the impurity regions and on the interlayer insulation film around the contact hole and a metal silicide layer diffusing and extending into the impurity regions from the bottom of the contact hole. Metal atoms constituting the metal silicide layer diffuse into the silicon substrate in larger amount than the Si atoms diffusing into the metal film. In the semiconductor device according to the above described still another aspect of this invention, the metal atoms constituting the above described metal silicide may be either Co or Ni.

In the semiconductor device according to the above described still another aspect, as metal atoms diffusing into the silicon substrate in larger amount than the Si atoms diffusing into the metal film at the time of heat treatment for generating silicide, for example, Co and Ni may be used. By adopting the above described metals, it becomes possible to form a metal silicide layer deeper into the impurity regions than that according to a prior art while using a conventional contact hole forming step and metal film forming step. Since the diameter of the above described metal silicide layer is expanded in the direction of the diameter so as to become larger than the diameter of the lower edge of the above described contact hole. As a result, it becomes possible to form proper contacts while miniaturizing the semiconductor device.

The method of manufacturing semiconductor devices according to one aspect of the invention includes the steps of implanting an impurity onto the main surface of the silicon substrate to form impurity regions, forming an interlayer insulation film covering the impurity regions, opening contact holes in the interlayer insulation film over the impurity regions, providing an enlarged recess with a diameter larger than that of the contact hole bottom in the impurity regions by etching the silicon substrate and forming a metal film on the contact hole bottom so as to fill in the expanded recess.

The manufacturing method according to the above described one aspect can reduce the contact resistance just by adding a simple modification to a manufacturing method according to a prior art. This method is also possible while miniaturizing the semiconductor device. It is desirable for the above described metal film not to grow only on the contact hole bottom but to grow integrally on the contact hole side walls and on the interlayer insulation film including the contact hole bottom. The above description is similarly applicable to the formation of the metal film in the following description.

In the manufacturing method of semiconductor devices according to the above described one aspect, as for the etching for providing an expanded recess onto the impurity regions either an isotropic etching or wet etching may be carried out.

By the above described etching, an enlarged recess with a diameter larger than that of the lower edge of the contact hole can be formed within the impurity regions, which can increase the contact area easily and at a low cost.

In the manufacturing method of semiconductor devices according to the above described one aspect, a metal film may be formed on the contact hole bottom so as to fill in the expanded recess using a metal CVD method.

By using the metal CVD method, a metal film can be formed so as to fill in the entire expanded recess of which outer periphery expands to the bottom of the interlayer insulation film, which can increase the contact area.

The method of manufacturing semiconductor devices according to another aspect of this invention includes the steps of implanting an impurity onto the main surface of the silicon substrate to form impurity regions, forming an interlayer insulation film covering the impurity regions, opening contact holes which penetrate the interlayer insulation film over the impurity regions and which reaches the impurity regions and forming a metal film covering the side walls and the bottom of the contact hole bottom surrounded by the impurity regions.

The configuration of the manufacturing method according to the above described another aspect can spare a broad contact area while miniaturizing the semiconductor device, and therefore it becomes possible to lower the contact resistance of the miniaturized semiconductor device.

The method of manufacturing semiconductor devices according to still another aspect of this invention includes the steps of forming impurity regions by implanting an impurity onto the main surface of the silicon substrate, forming an interlayer insulation film covering the impurity regions, opening contact holes in the interlayer insulation film above the impurity regions, forming a metal film on the bottoms of the contact holes and heat treatment for forming a metal silicide layer by causing reaction of the metal film and silicon, wherein the metal atoms forming the metal film diffuses into the silicon substrate in the amount larger than that of Si atoms diffusing into the metal layer. As for the above described metal film in the manufacturing method according to the still another aspect, a metal film of either Co or Ni may be used.

The above described metals such as Co or Ni diffuse into the silicon substrate in more amount than Si atoms diffusing into the metal film during the heat treatment step for forming metal silicide, and the metal silicide is formed in the silicon substrate from the bottom of contact holes. In this manufacturing method, the metal silicide layer is formed deeper than that of the prior art with the diameter larger than that of the lower edge of the contact holes. As a result, the conduct area is broadened so as to lower the contact resistance. This reduction of the contact resistance becomes possible by selecting materials for the metal film without a need for increase the number of steps compared to a manufacturing method according to a prior art. In addition, this reduction of the contact resistance becomes possible even when the semiconductor device is miniaturized.

In the manufacturing method of semiconductor devices according to the above described still another aspect of the invention, in the case that the metal film is a Co film, either the heat treatment below 450° C. or the heat treatment above 600° C. may be added as the heat treatment.

In the temperature range of 450° C. or lower 600° C. or higher, Co diffuses and penetrates into silicon to form a cobalt silicide. Therefore, the cobalt silicide layer is formed deep and extending wide in the impurity regions so as to increase the contact area easily, attaining lower the contact resistance. This method can be implemented only by selecting cobalt as the type of metal film without changing the processing steps, which can be easily implemented using the existing facilities.

In the method for manufacturing a silicon substrate according to the above described aspect, in the case that the metal film is a Co film, the step for selectively removing only the cobalt film followed by the heat treatment at the temperature not lower than 600° C. may be added after the heat treatment at the temperature of not higher than 450° C. as the heat treatment for forming the metal silicide.

In the above described method, $Co_2Si$ is formed in a position deeper than the impurity regions of silicon and then $CoSi_2$ is formed, therefore, the contact area can be easily increased even in a semiconductor device which is attempted to be miniaturized. This method can be implemented by selecting cobalt as the type of metal film without changing the processing steps, which can be implemented easily utilizing the existing facilities.

In the method for manufacturing semiconductor devices according to the above described still another aspect, the step of selectively removing the metal film other than the metal silicide layer after the heat treatment step for forming the metal silicide layer may be further included.

By removing the above described metal film, reaction between the metal film for interconnection and silicon can be completely prevented to secure a stable interconnection system. By removing the unreacted metal film remaining on the side walls of the contact holes, it can become easier to fill in the contact holes with the metal film.

In the method for manufacturing semiconductor devices according to the above described still another aspect, the step of forming the metal film, the heat treatment step of forming the metal silicide layer and the step of selectively removing the metal film other than the metal silicide layer may be repeated a plurality of times.

By the above described repetition, the metal silicide layer is formed deeper and broader in the impurity regions, and therefore, it becomes possible to broaden the contact area and to further lower the contact resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, the embodiments of the present invention are described in reference to the drawings.

First Embodiment

Figure 1:
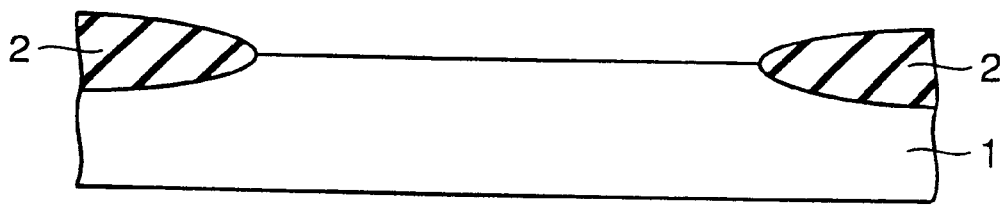
FIG. 1 is a cross section of a stage where an element isolating insulation film is formed on the silicon substrate in manufacturing a semiconductor device according to the first embodiment.
Figure 2:
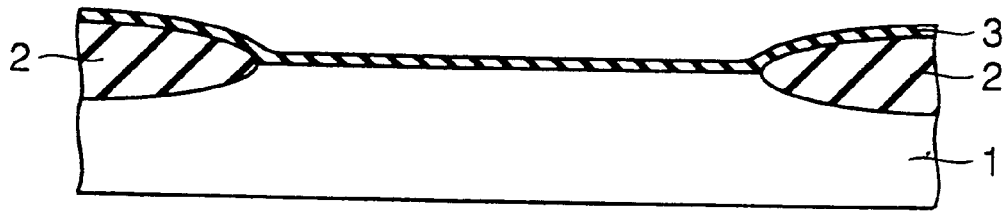
FIG. 2 is a cross section of a stage where a gate insulation film is further formed in the condition of FIG. 1.
Figure 3:
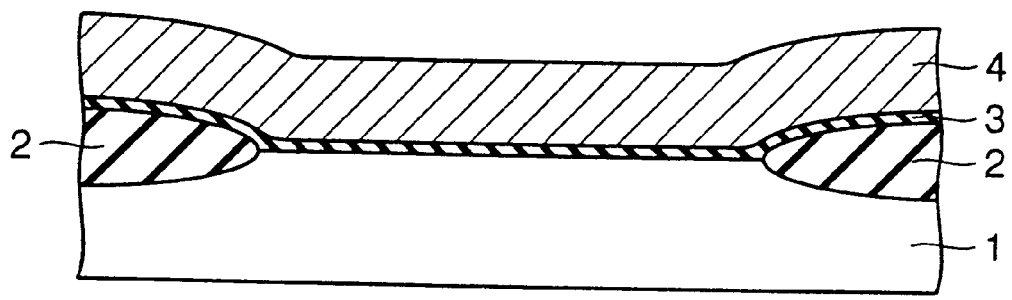
FIG. 3 is a cross section of a stage where a polycrystalline silicon is further formed in the condition of FIG. 2.
Figure 4:
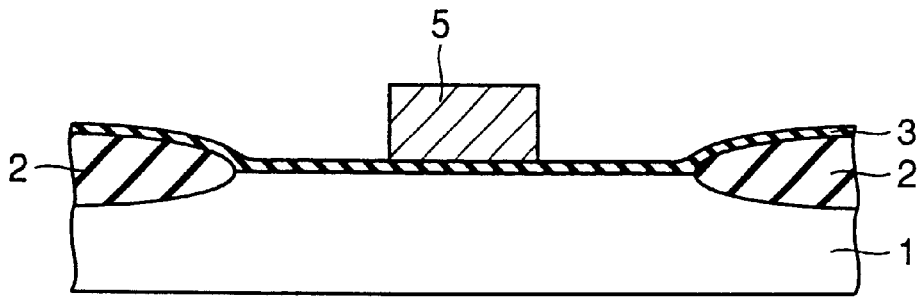
FIG. 4 is a cross section of a stage where a gate electrode is formed by patterning the polycrystalline silicon of the condition of FIG. 3.
Figure 5:
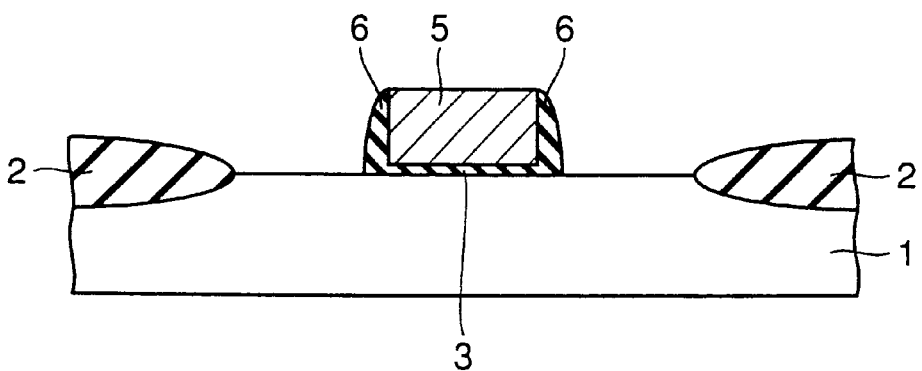
FIG. 5 is a cross section of a stage where side walls are formed on the gate electrode after removing the gate insulation film of the regions other than the regions immediately below the gate electrodes in the condition of FIG. 4.
Figure 6:
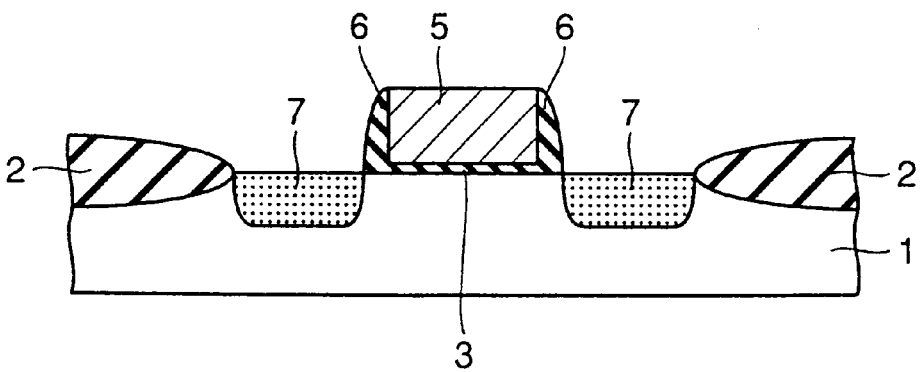
FIG. 6 is a cross section of a stage where source and drain regions are formed by implanting an impurity onto the silicon substrate on both sides of the side walls.

In this embodiment, a process for a semiconductor device is introduced wherein expanded recesses larger in diameter than that of the lower edge of the contact holes in the source and drain regions which are impurity regions are provided continuously in the lower edge of the contact holes and then a metal film is formed in the recesses so as to increase the contact area. As for the semiconductor device, the logic-type devices of the MPU or the like are the possible subject. First, an element isolating insulation film 2 is formed on a silicon substrate 1 so as to separate each element forming region (active region) (FIG. 1). Next, a gate insulation film 3 is formed on the entire surface of the above described silicon substrate (FIG. 2). Then, a polycrystalline silicon film 4 is formed on the entire surface of the above described silicon substrate (FIG. 3), and after that this is patterned to form a gate electrode 5 (FIG. 4). Though, here, an example is shown using a single layer of polycrystalline silicon as a gate electrode, a gate electrode of a so-called polycide structure where a metal silicide is layered on the polycrystalline silicon may be used. Next, side walls 6 are formed on both sides of the gate electrode (FIG. 5) and then impurity regions 7, which become source and drain regions, are formed in the silicon substrate 1 on the outside of the side walls 6 (FIG. 6). Successively the heat treatment is carried out to activate the impurity ions in the above described impurity regions 7.

Figure 7:
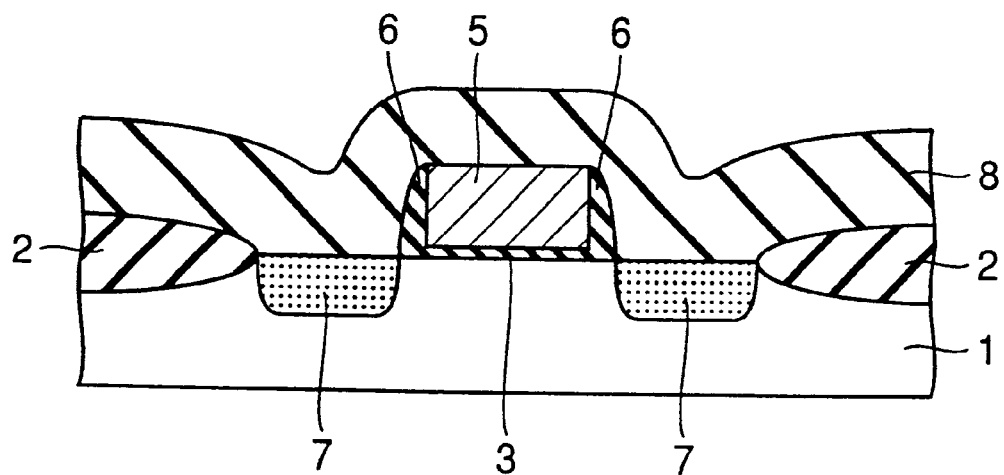
FIG. 7 is a cross section of a stage where an interlayer insulation film is formed over the condition of FIG. 6.
Figure 8:
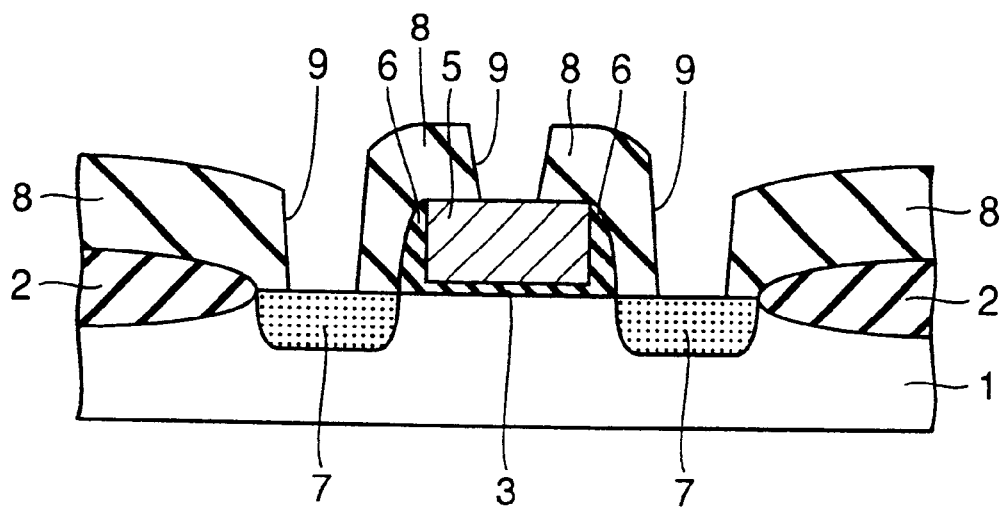
FIG. 8 is a cross section of a stage where contact holes are opened in the interlayer insulation film shown in the FIG. 7.
Figure 9:
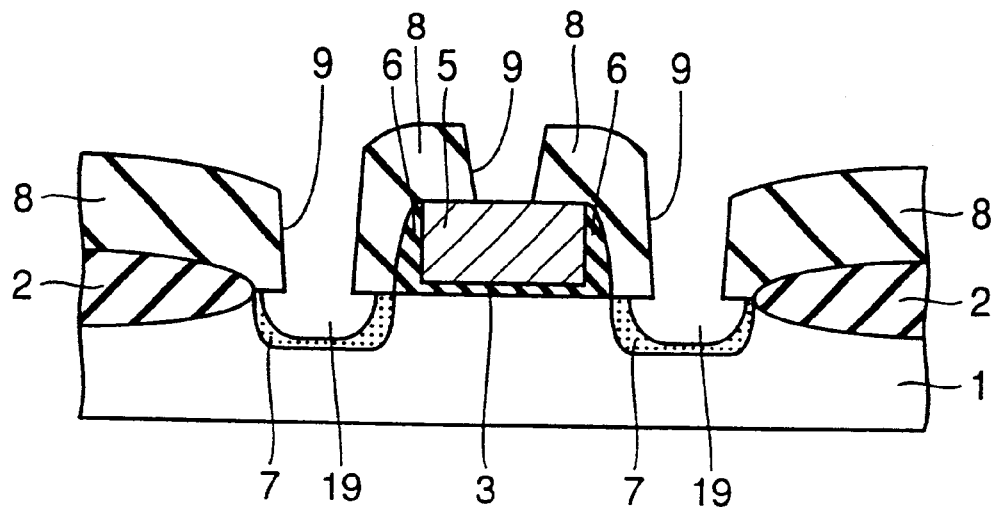
FIG. 9 is a cross section of a stage where expanded recesses are further provided in the source and drain regions of the condition of FIG. 8.

Next, as shown in FIG. 7, an interlayer insulation film 8 is formed from a PSG (Phosphate Silicate Glass) film, a BPSG (Boro-Phosphate Silicate Glass) film or the like over the enter surface of the silicon substrate. Next, the interlayer insulation film 8 is etched so that contact holes 9 are opened (FIG. 8). Successively, as shown in FIG. 9, an isotropic etching is performed to provide the silicon substrate 1 with expanded recesses 19. An anisotropic etching conditions (a) for the contact holes 9 as shown in FIG. 8 and an isotropic etching conditions (b) for providing the silicon substrate with expanded recesses 19 as shown in FIG. 9 are as follows, respectively.

(a) anisotropic etching conditions:
    etching gas: $C_4F_8 + O_2$ base
    flow ratio: approximately 2:1
(b) isotropic etching conditions:
    etching gas: $CF_4 + O_2$ base
    flow ratio: approximately 4:1

In either case, etching gases of fluorocarbon $(CxFy)+O_2$ are used for etching, which has the characteristics where the larger the ratio of C to F in CxFy is, the larger the degree of the anisotropic etching is. Therefore, switching from the anisotropic etching for the interlayer insulation film 8 to the isotropic etching for the silicon substrate can be carried out by switching the gases. The isotropic etching for providing the silicon substrate with the expanded recesses 19 as described above can be carried out by the following wet etching (c) in place of the above described dry etching.

Figure 10:
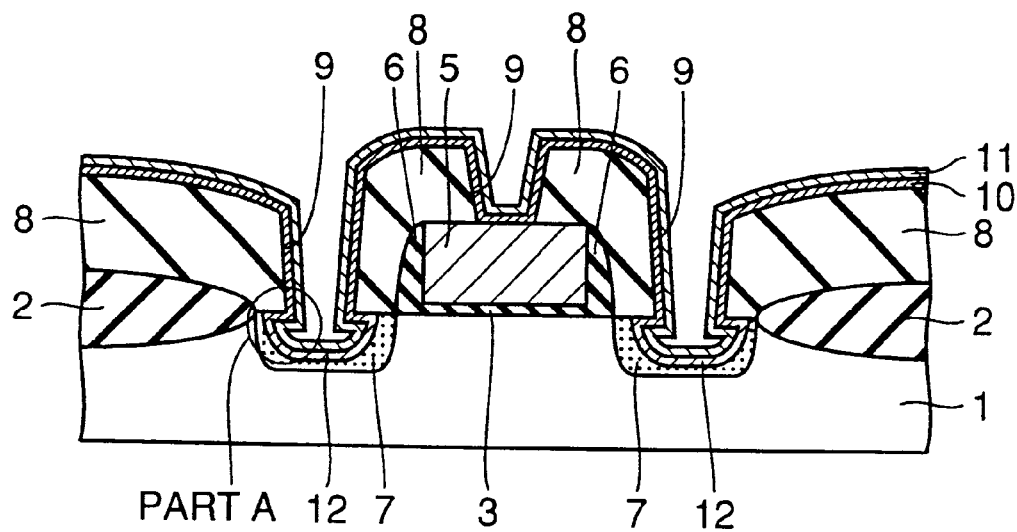
FIG. 10 is a cross section of a stage where the heat treatment for forming metal silicide is carried out after a metal film and a barrier layer are formed in the condition of FIG. 9.
Figure 11:
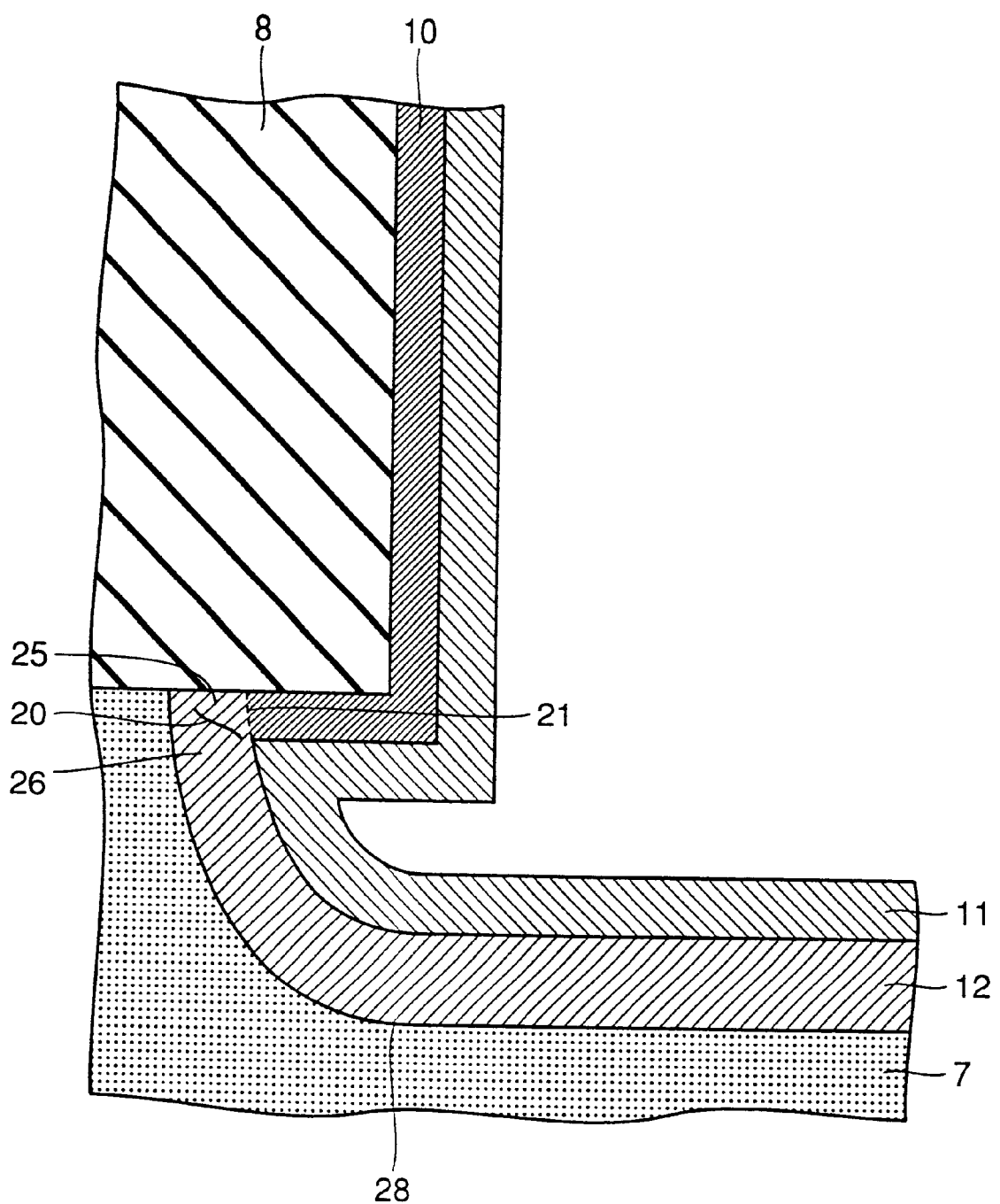
FIG. 11 is an enlarged view of part A in FIG. 10.
Figure 12:
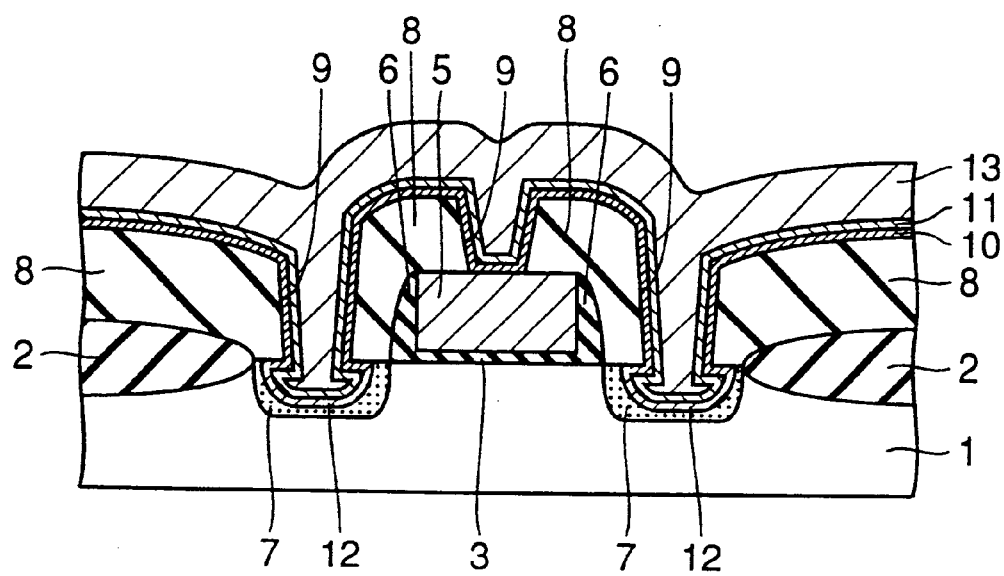
FIG. 12 is a cross section of a stage where a metal film for interconnection is formed in the condition of FIG. 10.
Figure 13:
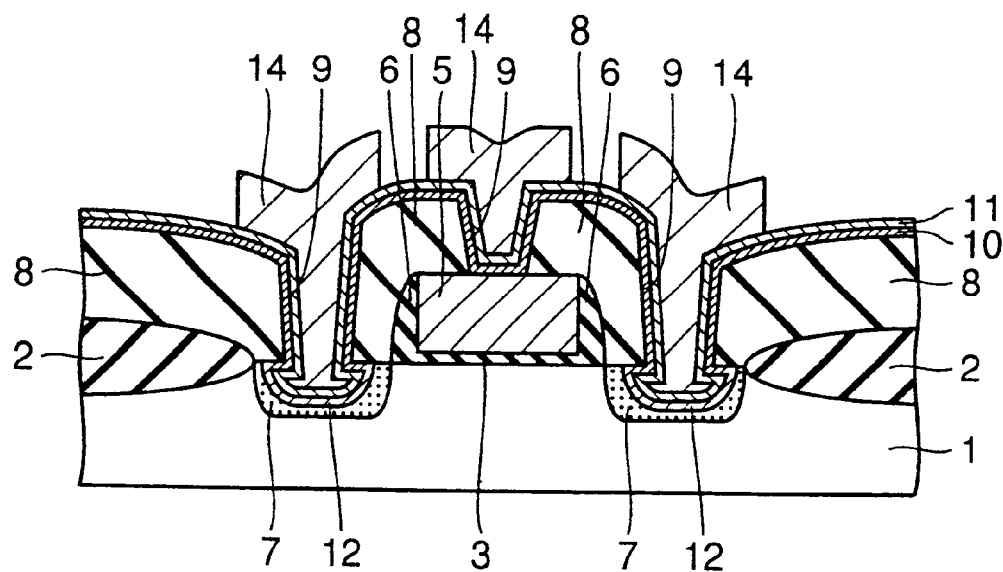
FIG. 13 is a cross section of a stage where source and drain interconnection and gate interconnection are formed by patterning the metal film for interconnection of the condition in FIG. 12 so as to complete a platform of the semiconductor device.

(c) wet etching conditions:
    etching liquid: hydrofluoric acid (HF)+nitric acid $(HNO_3)$ or ammonia water $(NH_4OH)$ Next, a metal film 10, which becomes a contact layer, is formed so as to fill in the above described enlarged recess 19 by a metal CVD method. This metal film 10 is formed along the silicon substrate surface in a recessed form on the bottoms of the enlarged recesses 19, and formed to cover the inside walls of the contact holes. In addition, a barrier layer 11 is formed thereon (FIG. 10). TiN or the like may be used for the barrier layer 11. Next, the structure of the metal film 10 formed as above will be described in detail. As described above, after a metal film 10 is formed by a metal CVD method, a metal silicide is formed in the parts where the metal film 10 and the silicon substrate 1 are in contact with each other by heat treatment. As shown in FIG. 11, the major parts of the above described metal film grows uniformly on the silicon substrate surface in a form of recess at the bottoms of the expanded recesses. A seam 20, however, is formed on the metal film formed in the corners of the expanded recesses. At the corners of the expanded recesses, when the metal film 10 grows through the metal CVD method, a metal film is generated on the bottom surface 27 of the interlayer insulation film 8, which is exposed in the expanded recesses 19, and on the silicon substrate surface 28 in a form of recess at the bottoms of the expanded recesses, and the metal film grows toward the middle of the expanded recesses. The metal film which has grown from the bottom surface 27 of the interlayer insulation film 8 (upper side metal film) and the metal film which has grown from the bottoms of the expanded recesses (Gower side metal film) meet to form the seam 20. When silicide forming processing through the heat treatment is carried out, both of the upper side metal film and the lower side metal film become metal silicide in the vicinity of the contact with the silicon substrate. That is to say, an upper side metal silicide 25 and a lower side metal silicide 26 are formed respectively. In FIG. 11, the border 21 exhibits the border where the metal silicide is formed, and on the above side of this border 21, the metal silicide is not generated because of the separation from the silicon substrate. After that, a metal film 13 is formed with tungsten or the like for forming interconnection (FIG. 12), and the metal film for interconnection is etched to form a metal interconnection 14 to complete the platform of the semiconductor device (FIG. 13). The metal film 13 is used only for filling in the contact holes, and therefore, another metal film for interconnection may be formed for forming the metal interconnection. The semiconductor device shown in this FIG. 13 can be used as a logic-type device of the MPU (Micro Processor Unit) or the like. In the case that capacitors are formed, it can be used as a memory such as a DRAM.

In the present embodiment, broad contact area can be formed by forming expanded recesses through isotropic etching or wet etching onto the silicon substrate following the opening of contact holes in the interlayer insulation film. Thus, it becomes possible to form good contacts easily and inexpensively even in a miniaturized semiconductor device. This method has the following advantages compared to the method disclosed in Japanese Patent Laying-Open No. 60-187060 mentioned above. According to the invention described in Japanese Patent Laying-Open No. 60-187060, trench parts formed in the substrate are filled in with metal silicide.

The above described process for manufacturing the semiconductor device has the following advantages compared to the method disclosed in Japanese Patent Laying-Open No. 60-187060. The difference with the method for forming the openings of contact holes and the trench parts of the substrate separately as disclosed with respect to the invention described in the Japanese Patent Laying-Open No. 60-187060 is in the point where the expanded recesses are formed in the silicon substrate following the formation of contact hole openings in the present embodiment. Thus, expanded recesses large in diameter can be provided in the substrate at the bottoms of the contact holes in self-aligned manner with an advantage that the number of steps can be reduced.

Second Embodiment

Figure 14:
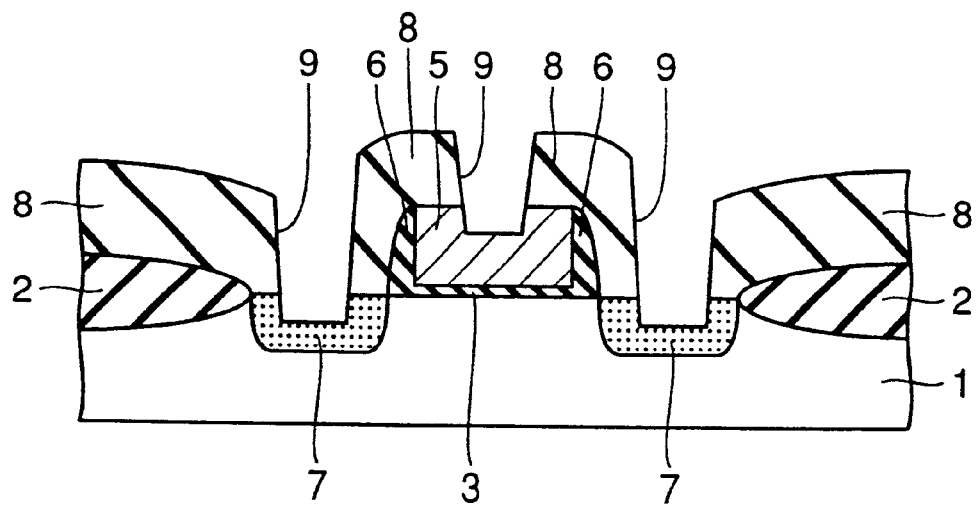
FIG. 14 is a cross section of a stage where contact holes are opened in the interlayer insulation film in the process for a semiconductor device according to the second embodiment.
Figure 15:
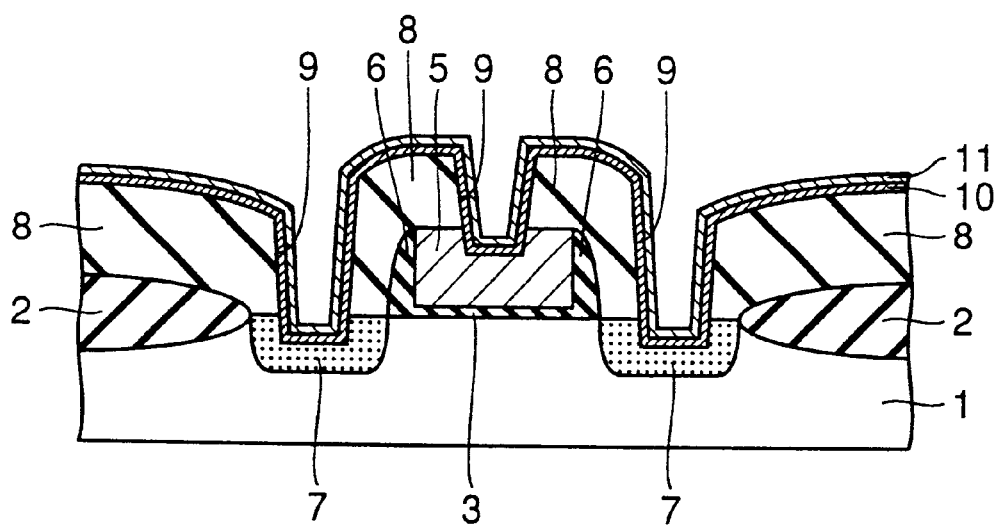
FIG. 15 is a cross section of a stage where a metal film and a barrier layer are formed on the condition of FIG. 14.
Figure 16:
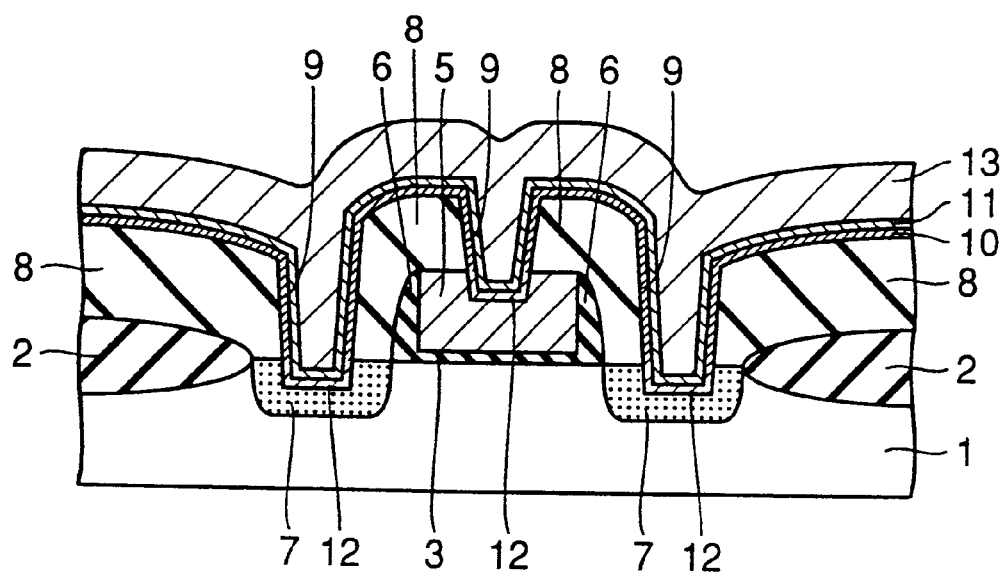
FIG. 16 is a cross section of a stage where a metal film for interconnection is formed after the heat treatment for forming metal silicide is carried out onto the condition of FIG. 15.

In the present embodiment, contact holes are opened so as to reach the source and the drain regions penetrating through the interlayer insulation film so as to increase the contact area. First, a process for manufacturing a semiconductor device according to the embodiment is described. In the embodiment, after forming an interlayer insulation film, contact holes 9 are opened reaching the source and the drain penetrating through the interlayer insulation film. Contact holes are also opened on top of the gate electrodes 5. In this case, as shown in FIG. 14, the first feature of this embodiment is to carry out etching deep into the silicon substrate 1. For the etching at this time, the etching conditions (a) shown in the embodiment 1 are used. Next, a metal film 10 and a barrier layer 11 are formed in sequence (FIG. 15). Then, by heat treatment, a metal silicide 12 is formed by reacting the metal layer 10 formed on the bottoms and on the side walls of contact holes formed deep into the silicon substrate (FIG. 16). Here, the second feature of this embodiment is to form a metal silicide 12 on the bottoms and on the side walls of contact holes formed deep into the substrate.

Figure 17:
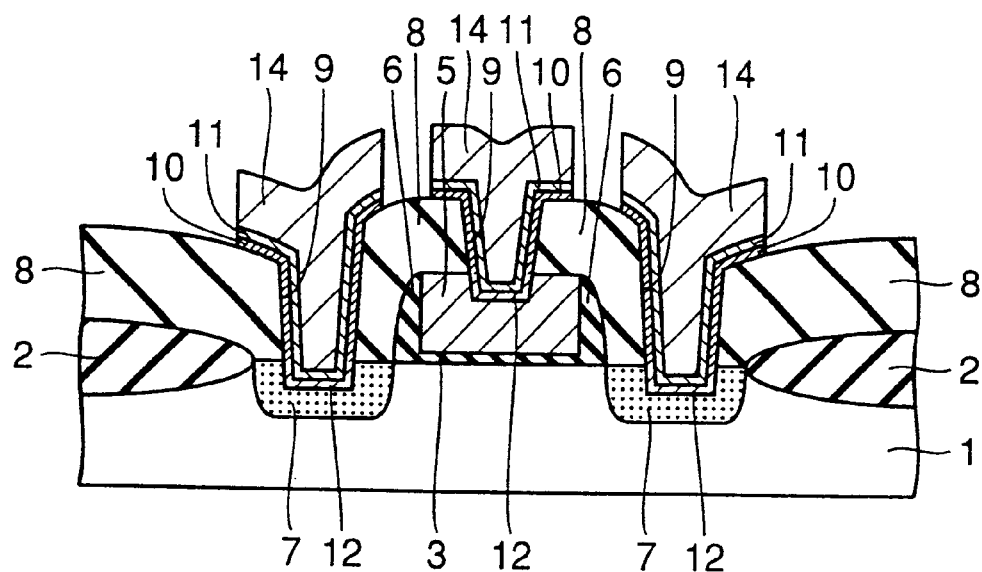
FIG. 17 is a cross section of a stage where source and drain interconnection is formed by patterning the metal film for interconnection of FIG. 16.

After this, a metal film 13 for interconnection made of tungsten is formed (FIG. 16). At this time, the bottom of the contact holes dug into the substrate is filled with the metal film 13 for interconnection. In addition, the metal film 13 for interconnection is etched to form metal interconnection 14 (FIG. 17). The semiconductor device shown in FIG. 17 is used for a logic-type device of the MPU or the like. In addition, in the case that capacitors are formed, it can be used at the memory such as a DRAM.

The above described process for manufacturing the semiconductor device has the following advantages compared to the method disclosed in Japanese Patent Laying-Open No. 60-187060. The difference from the method of forming the contact hole openings and trench parts of the substrate separately as disclosed with respect to the invention described in Japanese Patent Laying-Open No. 60-187060 is in the point where etching is carried out for digging the silicon substrate at the time of forming contact hole openings in the present embodiment. Therefore, the digging into substrate can be achieved at the bottom of contact holes in a self-aligned manner with an advantage that the number of steps can be reduced.

In the invention described in the Japanese Patent Laying-Open No. 60-187060, trench part formed in the substrate is filled in with metal silicide. Here, in the case the trench parts are filled in with metal silicide, the resistance of the metal silicide film is added to the contact resistance so as to increase the resistance, because metal silicide is high in the resistance compared to metal. On the other hand, in the case that the trench parts are filled in with metal, reaction occurs between the silicon and the metal by the heat treatment after forming the contact parts. When silicon and metal react, not only the resistance increase but also the possibility of defective contacts exists through the generation of voids. In this embodiment, there is the effect that an area of the interface between the silicon and the silicide contributing to the contact resistance increases, because a metal silicide layer is formed on the bottoms and on the side walls of the contact holes dug into the substrate. As the bottoms of the contact holes, which is dug into the substrate, are filled in with metal, the resistance can be lowered, and as the barrier layer 11 is interposed between the metal interconnection 14 and the metal silicide layer 12, the metal can not be formed into silicide when the heat treatment is applied after forming the interconnection.

Third Embodiment

This embodiment introduces a semiconductor device wherein, by forming a metal silicide layer as thick as possible in the silicon substrate from the bottoms of the contact holes, the area of the interface between the silicon and the metal silicide layer is increased so as to reduce the contact resistance.

Figure 18:
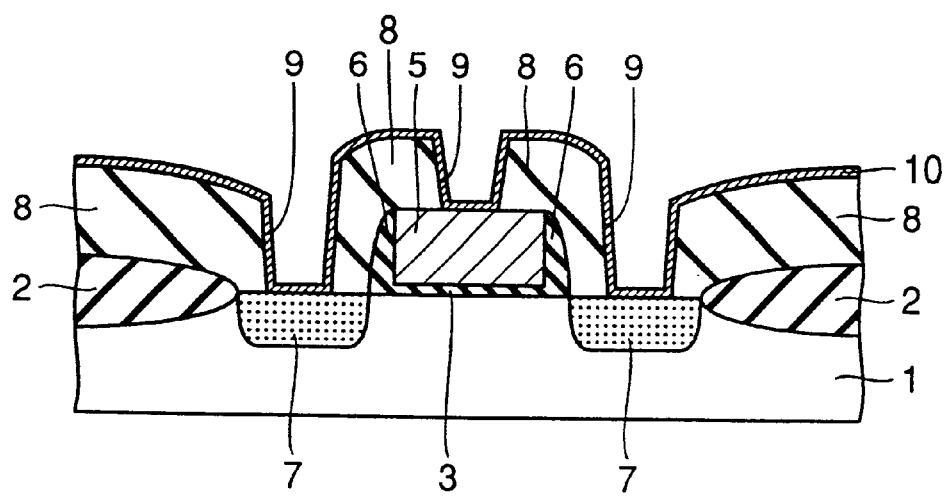
FIG. 18 is a cross section of a stage where a metal film is formed on the inside of the contact holes and on the interlayer insulation film in the process for a semiconductor device according to the embodiment 3.
Figure 19:
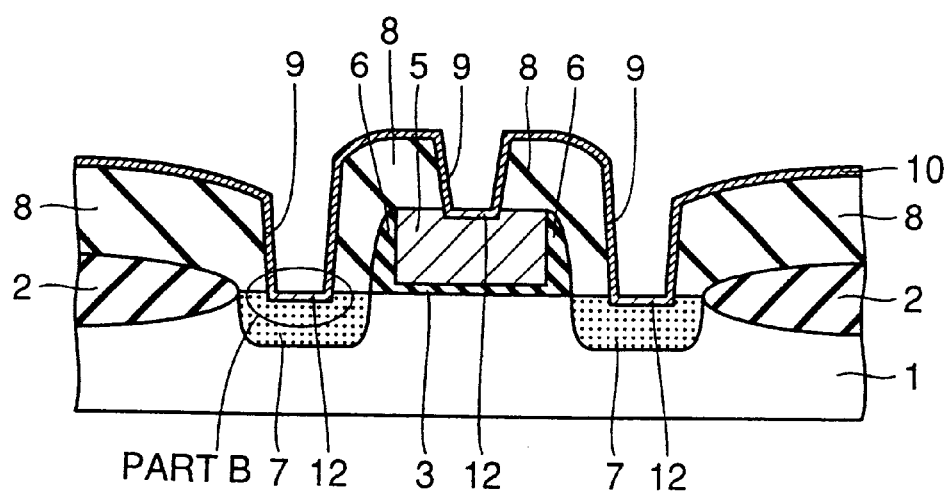
FIG. 19 is a cross section of a stage where a metal silicide layer is formed on the bottom of contact holes by carrying out the heat treatment for forming metal silicide onto the condition of FIG. 18.
Figure 20:
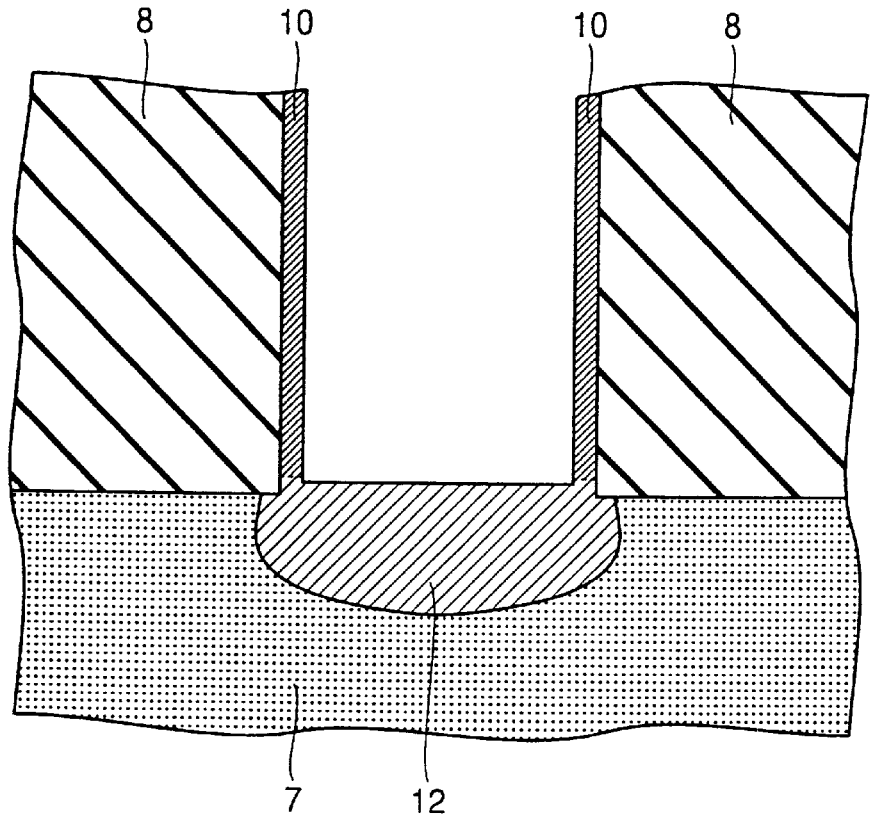
FIG. 20 is an enlarged view of part B of FIG. 19.

First, an interlayer insulation film 8 is formed and then contact holes 9 are opened on top of the gate electrode 5 and in the source and the drain regions 7 to form a metal film 10 (FIG. 18). For this metal film 10, such a metal that causes when the heat treatment for forming metal silicide is applied, a larger number of metal atoms to diffuse into the silicon than the amount of Si atoms diffusing and penetrating into the metal film. As for examples of this metal, cobalt (Co) and nickel (Ni) can be sited. By the heat treatment for forming silicide, the metal film 10 and the silicon react to form the above described metal silicide layer (FIG. 19). An enlarged view of part B of FIG. 19 is shown in FIG. 20. At the time of the heat treatment for forming metal silicide, metal atoms diffuse into the silicon in the amount larger than the Si atoms diffusing into the metal film. Therefore, as shown in FIG. 20, it becomes possible to form a deep metal silicide layer 12. The diameter of the metal silicide which corresponds to the diffusion distance, is broader than the diameter of the lower edge of the contact holes. On the contrary, titanium (Ti) used for a contact layer according to a prior art forms metal silicide by causing the silicon to diffuse into the metal, and therefore, the formed silicide layer becomes shallow. The diameter does not become significantly larger than the diameter of the lower edge of the contact holes.

Figure 21:
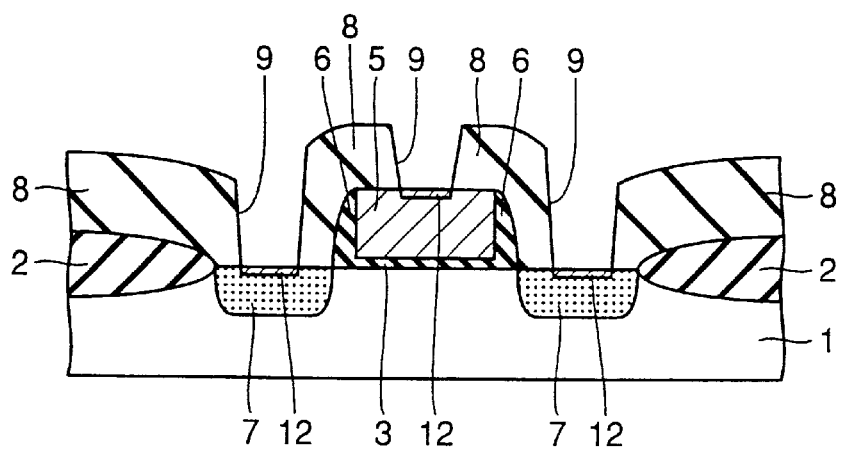
FIG. 21 is a cross section of the condition of FIG. 19 after carrying out a processing for removing the metal film other than the metal silicide.
Figure 22:
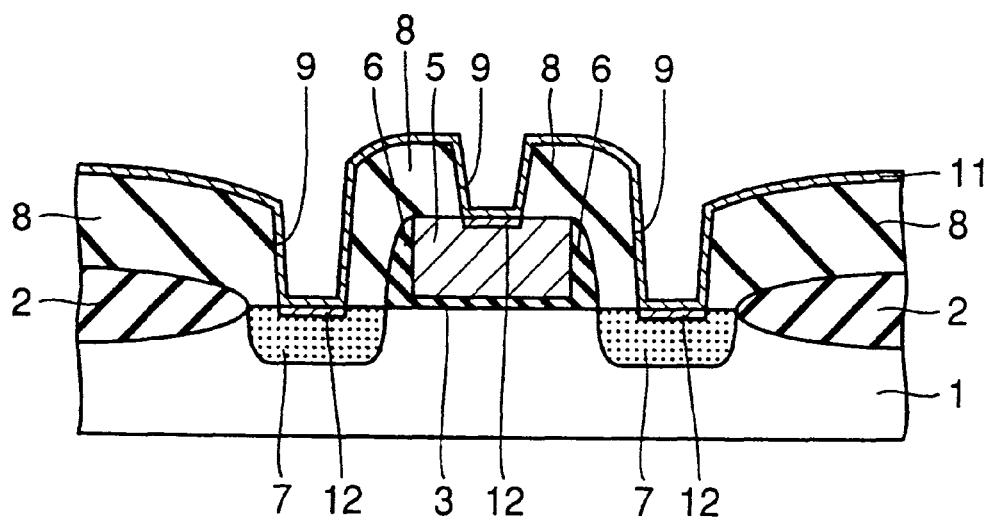
FIG. 22 is a cross section of a stage where a barrier layer is formed on the condition of FIG. 21.
Figure 23:
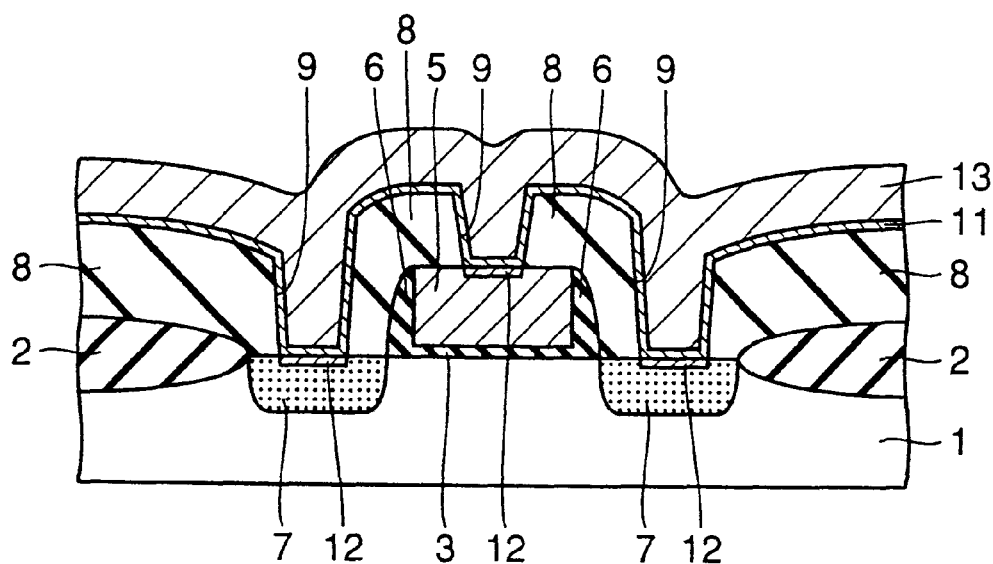
FIG. 23 is a cross section of a stage where a metal film for interconnection is formed on the condition of FIG. 22.
Figure 24:
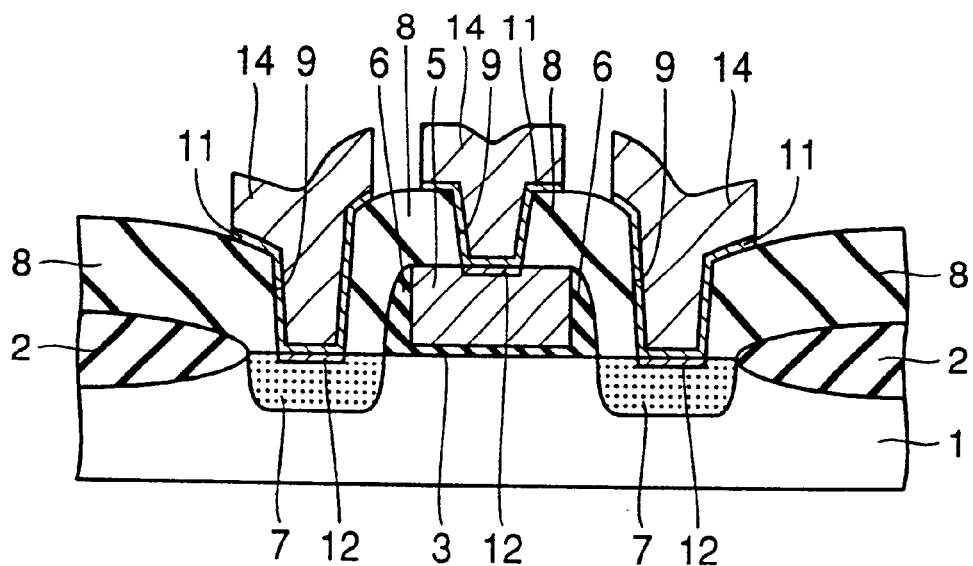
FIG. 24 is a cross section of a stage where a source and drain interconnection and gate interconnection are formed by carrying out a patterning processing onto the metal film for interconnection of the condition of FIG. 23.
Figure 25:
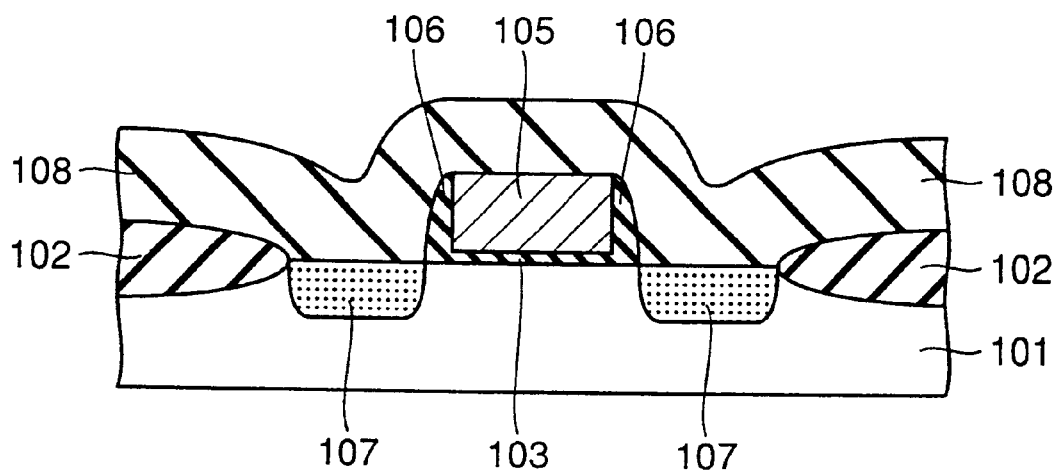
FIG. 25 is a cross section of a stage where an interlayer insulation film is formed in a process of a semiconductor device according to a prior art.
Figure 26:
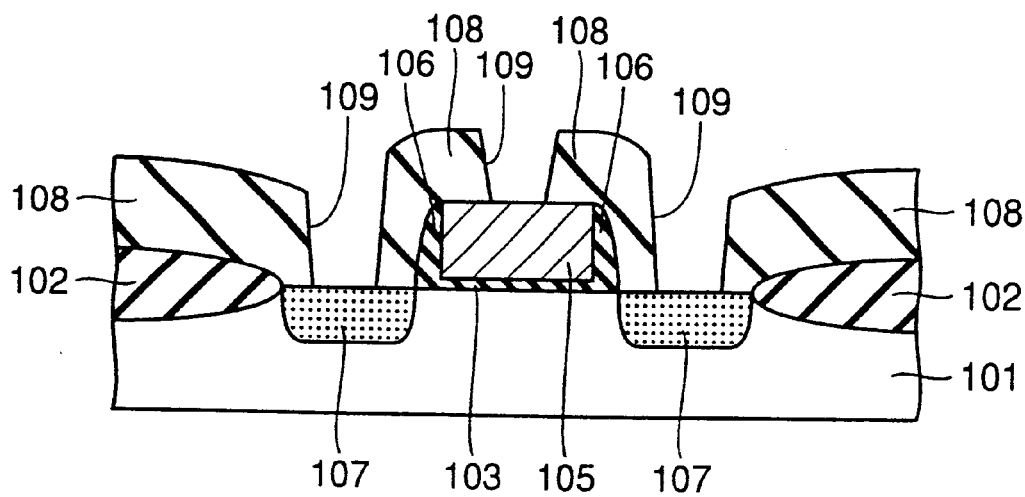
FIG. 26 is a cross section of a stage where contact holes are opened in the condition of FIG. 25.
Figure 27:
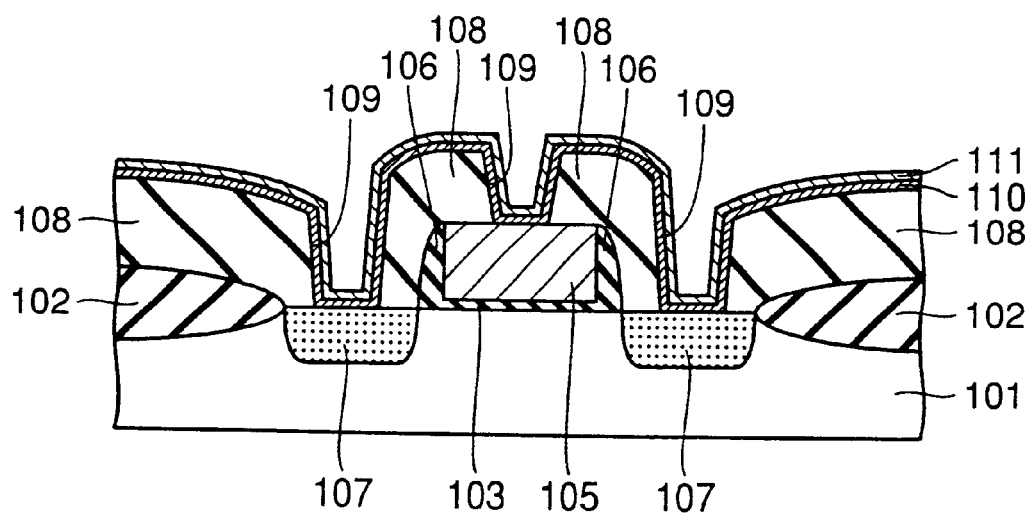
FIG. 27 is a cross section of a stage where a metal film and a barrier layer are provided in sequence on the inside of the contact holes and on the interlayer insulation film of FIG. 26.
Figure 28:
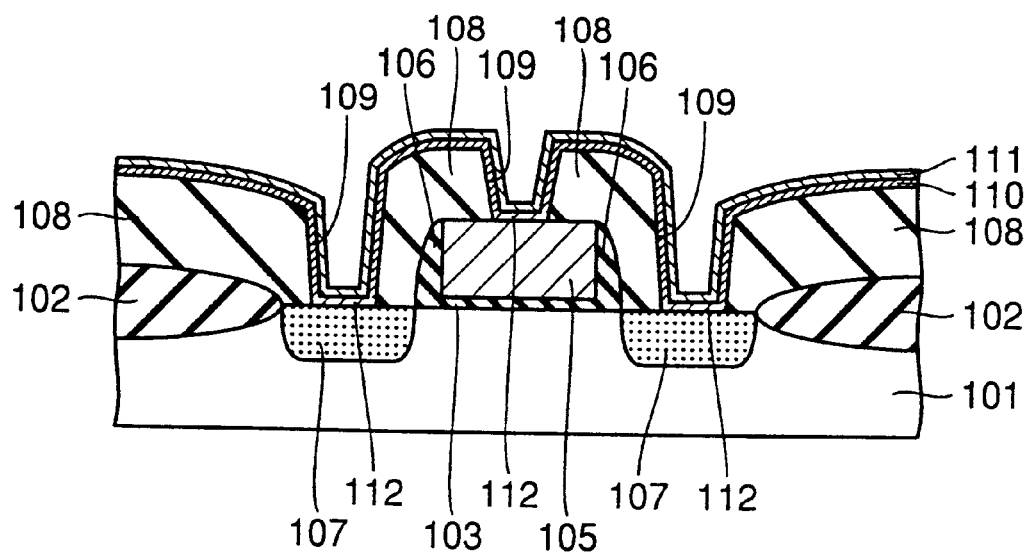
FIG. 28 is a cross section of a stage where the heat treatment for forming metal silicide is carried out onto the condition of FIG. 27.
Figure 29:
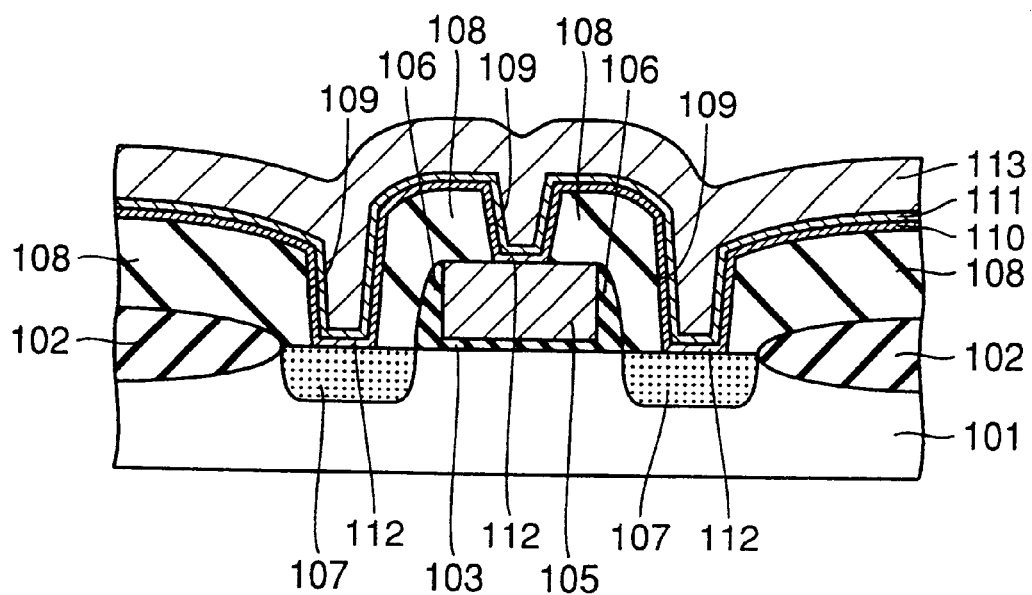
FIG. 29 is a cross section of a stage where a metal film for interconnection is formed onto the condition of FIG. 28.
Figure 30:
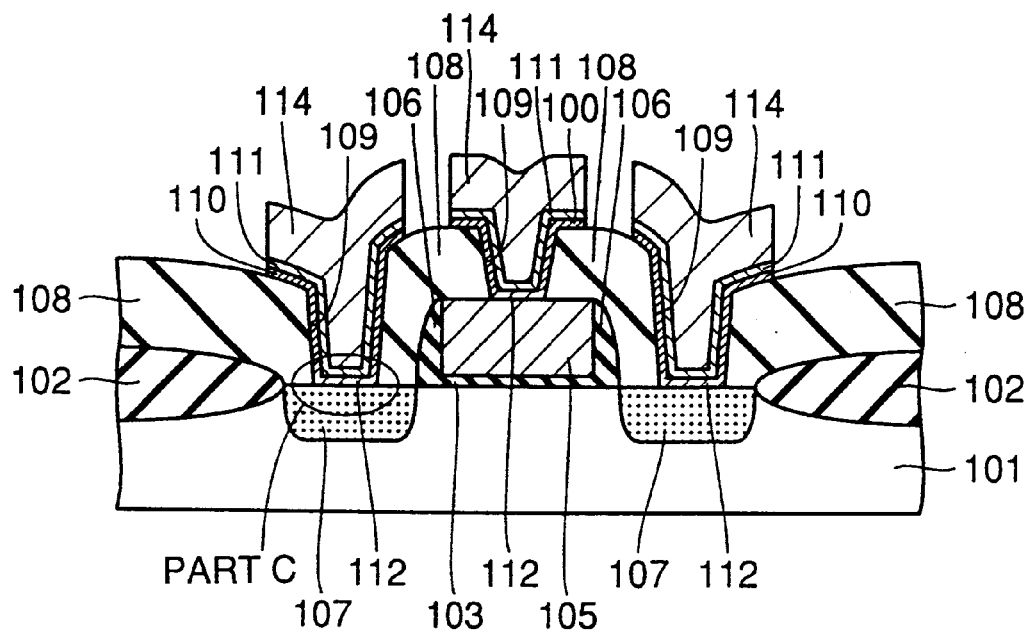
FIG. 30 is a cross section of a stage where source and drain interconnection and gate interconnection are formed by patterning the metal film for interconnection onto the condition of FIG. 29.
Figure 31:
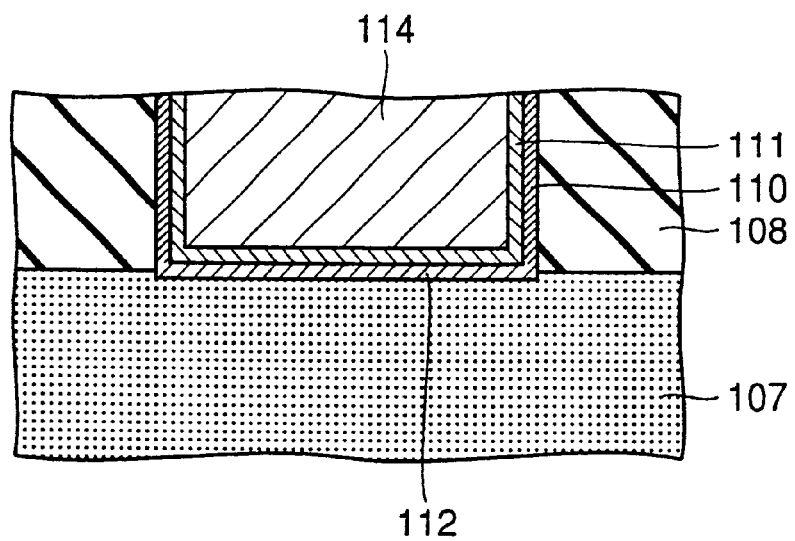
FIG. 31 is an enlarged view of part C of FIG. 30.

Next, the metal layer 10 is removed selectively using the liquid which can dissolve the metal layer 10 without dissolving the metal silicide 12, for example (sulfuric acid+ hydrogen peroxide) (FIG. 21). This removal of the metal later 10 may be omitted. It cannot be omitted, however, in the case that the metal silicide layer is formed deep in the source and drain regions, as described in the following, by repeating the process of (formation of metal film 10→heat treatment for forming metal silicide→removal of metal layer 10). This is because the metal film 10 narrows the contact holes when the removal of this metal layer 10 is not carried out. After that, a barrier layer is formed from TiN on top of that (FIG. 22). Then a metal film 13 for interconnection is formed with tungsten for forming interconnection (FIG. 23). In addition, the metal film 13 for interconnection is etched to form metal interconnection 14 (FIG. 24).

The point of this embodiment is that metal is used of which atoms diffuse into the silicon substrate in the amount larger than the Si atoms diffused into the metal film so as to cause a reaction of forming metal silicide at a place deep in the silicon substrate. When a silicide layer 12 is formed on the contact bottom through heat treatment for forming metal silicide in a self-aligned manner, metal atoms diffuse in the silicon so as to form a metal silicide layer deep in the silicon layer. In the case that a metal silicide is formed deep in the substrate, it becomes possible to expand the contact area S of interface between the silicon and the metal silicide can be expanded in the vertical direction to the wafer. As a result, even in the semiconductor device which is miniaturized, low contact resistance can be gained. The above described semiconductor device can be used as MPU logic-type device. However, it can also be used as a memory such as a DRAM by forming capacitors or the like.

The case where Co is used for the metal film is described in further detail. A reaction of forming silicide of Co is known to cause the following reactions according to temperature.

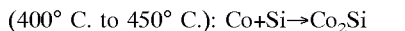
(400° C. to 450° C.): Co+Si→Co$_2$Si
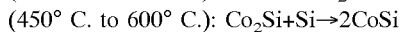
(450° C. to 600° C.): Co$_2$Si+Si→2CoSi
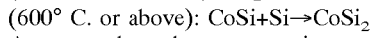
(600° C. or above): CoSi+Si→CoSi$_2$ Among the above reactions, the reaction of Co+Si→Co$_2$Si and the reaction of CoSi+Si→CoSi$_2$ proceed as metal atoms diffuse into the silicon. On the other hand, the reaction of Co$_2$Si+Si→2CoSi proceeds as silicon diffuses into the metal. Accordingly, as shown in FIG. 19, the heat treatment for forming metal silicide is effective when being carried out at 450° C. or less or at 600° C. or more. After the heat treatment of 450° C. or less, the metal film is selectively removed and, after that, the heat treatment at 600° C. or more may be performed.

As for a method of forming deeper metal silicide layer, the steps (d$_1$)→(d$_2$)→(d$_3$) may be repeated a plurality of times in which (d$_1$) after forming a film of a metal layer 10 (FIG. 18), (d$_2$) metal silicide 12 is formed by heat treatment (FIG. 19), and (d$_3$) the unreacted metal layer is selectively removed (FIG. 21). By repeating the process for forming metal silicide a plurality of times, the metal silicide is formed much deeper so as to increase the contact area between the silicon and the metal silicide. Therefore, the contact resistance can be reduced while attaining the miniaturization of the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming an impurity region by implanting an impurity into a main surface of a silicon substrate;
   forming an interlayer insulation film covering said impurity region;
   opening a contact hole in the interlayer insulation film above said impurity region;
   providing an expanded recess larger in diameter than the bottom of said contact hole in said impurity region by etching said silicon substrate following the opening of said contact hole; and
   forming a metal film on the bottom of said contact hole so as to fill in said expanded recess.

2. The method of manufacturing a semiconductor device according to claim 1, wherein etching for providing said expanded recess in said impurity region is carried out by either isotropic etching or wet etching.

3. The method of manufacturing a semiconductor device according to claim 1, wherein the metal film is formed on the bottom of the contact hole so as to fill in said expanded recess by using the metal CVD (Chemical Vapor Deposition) method.

4. A method of manufacturing a semiconductor device, comprising the steps of:
   forming an impurity region by implanting an impurity into a main surface of a silicon substrate;
   forming an interlayer insulation film covering said impurity region;
   opening a contact hole penetrating through the interlayer insulation film above said impurity region and reaching the impurity region;
   forming an expanded recess in said impurity region having a larger diameter than said contact hole; and
   forming a metal layer covering the side walls and the bottom surface of the bottom of said expanded recess surrounded by said impurity region.

5. The method of claim 4, wherein the step of forming an expanded recess is performed such that said expanded recess extends underneath the interlayer insulation film.

6. The method of manufacturing a semiconductor device according to claim 4, wherein at least a portion of said contact hole extends into said impurity region below an upper surface of said impurity region.

7. A method of manufacturing a semiconductor device, comprising the steps:
   forming an impurity region by implanting an impurity into a main surface of a silicon substrate;
   forming an interlayer insulation film covering said impurity region;
   opening a contact hole in the interlayer insulation film above said impurity region;
   forming a metal film on the bottom of said contact hole; and
   heat treatment for forming a metal silicide layer by causing reaction between said metal film and the silicon;
   wherein metal atoms making up said metal film diffuse into the silicon substrate in an amount larger than the amount of Si atoms diffusing into said metal film when said silicide forming reaction occurs, and the metal silicide layer formed by said heat treatment has a broader upper part than the diameter of the bottom of the contact hole.

8. The method of manufacturing a semiconductor device according to claim 7, wherein said metal film is a metal film of either Co or Ni.

9. The method of manufacturing a semiconductor device according to claim 7, wherein in the case that said metal film is Co film, either heat treatment of 450° C. or less or heat treatment of 600° C. or more is applied as the heat treatment for forming the metal silicide layer.

10. The method of manufacturing a semiconductor device according to claim 7, wherein in the case that said metal film is Co film, after said heat treatment at 450° C. or less is applied as the heat treatment for forming said metal silicide layer, the step of selectively removing only said cobalt film and, subsequently, the step of heat treatment at 600° C. or more are added.

11. The method of manufacturing a semiconductor device according to claim 7 further comprising the step of selectively removing the metal film other than the metal silicide layer after the heat treatment step for forming said metal silicide layer.

12. The method of manufacturing a semiconductor device according to claim 11, wherein the step of forming said metal film, the heat treatment step of forming said metal silicide layer and the step of selectively removing the metal film other than the metal silicide layer are repeated a plurality of times.

* * * * *